(12) United States Patent
Weber et al.

(10) Patent No.: US 6,218,279 B1
(45) Date of Patent: Apr. 17, 2001

(54) VERTICAL FUSE AND METHOD OF FABRICATION

(75) Inventors: Stefan J. Weber; Axel Christoph Brintzinger, both of Fishkill; Roy Iggulden, Newburgh; Mark Hoinkis, Fishkill; Chandrasekhar Narayan; Robert Van den Berg, both of Hopewell Junction, all of NY (US)

(73) Assignees: Infineon Technologies North America Corp., San Jose, CA (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/512,648

(22) Filed: Feb. 24, 2000

Related U.S. Application Data

(62) Division of application No. 09/255,767, filed on Feb. 23, 1999.

(51) Int. Cl.[7] ................................................ H01L 21/44
(52) U.S. Cl. ........................ 438/601; 438/131; 438/132; 438/28; 438/467; 438/257; 438/529

(58) Field of Search ................................. 438/131, 132, 438/215, 281, 333, 467, 601, 700; 257/209, 529

(56) References Cited

U.S. PATENT DOCUMENTS 5,068,706 * 11/1991 Sugia et al. .......................... 357/51

* cited by examiner

*Primary Examiner*—David Nelms
*Assistant Examiner*—Dung A Le
(74) *Attorney, Agent, or Firm*—Stanton C. Braden

(57) ABSTRACT

A fuse for semiconductor devices in accordance with the present invention includes a substrate having a conductive path disposed on a surface thereof, a dielectric layer disposed on the substrate and a vertical fuse disposed perpendicularly to the surface through the dielectric layer and connecting to the conductive path, the vertical fuse forming a cavity having a liner material disposed along vertical surfaces of the cavity, the vertical surfaces being melted to blow the fuse. Methods for fabrication of the vertical fuse are also included.

24 Claims, 7 Drawing Sheets

VERTICAL FUSE AND METHOD OF FABRICATION

This is a divisional, of application Ser. No. 09/255,767 filed Feb. 23, 1999.

BACKGROUND

1. Technical Field

This disclosure relates to semiconductor fabrication and more particularly, to a vertical fuse and method for reducing semiconductor chip layout area.

2. Description of the Related Art

Semiconductor devices such as memory devices include fuses within their structure. In dynamic random access memory (DRAM) chips, the number of fuses increases significantly for each new generation of DRAM chip designs due to increases in memory density. In conventional DRAM designs, fuses either laser blown or electrically blown, are disposed parallel to the chip direction. Fuses in this orientation will be called horizontally disposed fuses or horizontal direction fuses. Horizontally disposed fuses consume roughly 3% of the total chip area together with fuse circuitry.

One use for fuses in memory devices is to activate/deactivate areas or blocks of the chip. This may be done using anti-fuses and fuses, respectively. For example, to improve chip yield redundancies are employed which are activated by blowing fuses. For next generation DRAMs the areas for fuses will be increased significantly due to, among other things, increased redundancy. For example, if a conventional DRAM chip included 15,000 fuses, a next generation DRAM chip may include about 30,000 to about 50,000 fuses.

The present invention provides a vertically disposed fuse which may advantageously by formed without additional process and mask steps, along with metal structures of a semiconductor device. The following is a brief description of the formation of contacts/metal lines for a dual damascene process.

Referring to FIG. 1, a semiconductor device 10 is shown. Semiconductor device includes a substrate 12. A dielectric layer 14 is deposited and patterned according to processes known in the art. Dielectric layer 14 may include an oxide such as TEOS or BPSG. A conductive material 16 is deposited on dielectric layer 14. Conductive material 16 includes a metal such as tungsten or aluminum. Conductive material 16 forms metal lines or other conductive structures, for example at an M0 level of a dynamic random access memory chip.

Referring to FIG. 2, a dielectric layer 18 is deposited on dielectric layer 14 and conductive layer 16. Dielectric layer 18 is an oxide such as silicon dioxide. Dielectric layer 18 is patterned and etched to form a contact hole 20 and metal line trench 22 for a dual damascene deposition of a conductive material 24 such as aluminum as shown in FIG. 3. A chemical mechanical polishing (CMP) is performed to planarize a top surface and remove conductive material 24 from the surface.

Referring to FIG. 4, a dielectric layer 26 is deposited on dielectric layer 18 and over a contact/metal line 28 formed in dielectric layer 18. Dielectric layer 26 is preferably an oxide such as silicon dioxide.

Referring to FIGS. 5 and 6, dielectric layer 26 is patterned and etched to form a via hole 32 and metal line trench 34 for a dual damascene deposition of a conductive material 36 such as aluminum to form a via/metal line 38 as shown in FIG. 6. CMP is performed to planarize the top surface and remove conductive material 36 from the surface.

The process described in FIGS. 1–6 is performed across semiconductor device 10. Contact/metal line 28 and via/metal line 38 are formed within a memory array portion 30 of a memory chip, for example.

Therefore, a need exists for reducing the area occupied by fuses on a semiconductor chip. A further need exists for a method of adjusting the fuse resistance for the fuses in a semiconductor device. A still further need exists for fabricating fuses without the additional process steps and masks.

SUMMARY OF THE INVENTION

A fuse for semiconductor devices in accordance with the present invention includes a substrate having a conductive path disposed on a surface thereof, a dielectric layer disposed on the substrate and a vertical fuse disposed perpendicularly to the surface through the dielectric layer and connecting to the conductive path, the vertical fuse forming a cavity having a liner material disposed along vertical surfaces of the cavity, the liner material along vertical surfaces being melted to blow the fuse.

In alternate embodiments, the liner material preferably includes titanium nitride and the fuse preferably includes aluminum. The dielectric layer may include multiple dielectric layers. The conductive path may include a conductive line perpendicularly disposed to the fuse to form a bend between conductive line and the fuse. The current flow through the fuse may directed from the bend toward the cavity. The liner material preferably has a resistivity greater than other portions of the fuse.

A method for fabricating vertical fuses includes the steps of forming a fuse hole vertically in a dielectric layer of a semiconductor device, lining sides of the fuse hole with a conductive layer and depositing a conductive material in the fuse hole wherein the conductive layer has a resistivity greater than the conductive material, the conductive material forming a cavity having the conductive layer disposed on vertical surfaces of the cavity.

A method for fabricating vertical fuses simultaneously with contact and via structures for memory chips includes the steps of providing a memory chip including a substrate having devices formed thereon in a memory array portion of the chip, the chip further including a fuse region, depositing a first dielectric layer on the substrate, forming contacts through the first dielectric layer, depositing a second dielectric layer, simultaneously forming fuse holes and via holes, the fuse holes being formed vertically through the first and second dielectric layers, the via holes being formed down to the contacts, lining sides of the fuse holes and the via holes with a conductive layer and depositing a conductive material in the fuse holes and the via holes wherein the conductive layer has a resistivity greater than the conductive material, the conductive material deposited in the fuse holes forming a cavity in the fuse hole having the conductive layer disposed on vertical surfaces of the cavity, the fuse holes forming a larger opening than the via holes such that the same process forms cavities in the fuse holes while the via holes are filled.

In other methods, the step of depositing may include the step of depositing the conductive material using a dual damascene process. The step of depositing may include the steps of depositing a wetting layer of conductive material and depositing the conductive material in the fuse hole to form the cavity. The wetting layer is preferably deposited using a chemical vapor deposition process. The conductive material is preferably deposited using a physical vapor deposition process. The step of adjusting one of a conductive layer thickness and cavity dimensions to provide a predetermined blow voltage for the fuse may be included. The conductive material preferably includes aluminum and the conductive layer includes titanium nitride. The method may further include the step of matching a fuse resistance to a resistance in external circuitry to which the fuse is connected.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

This disclosure relates to semiconductor fabrication and more particularly, to a vertical fuse and method for reducing semiconductor chip layout area. The present invention includes a method for manufacturing fuses with a line direction perpendicular to the plane of the chip. The fuses in accordance with the present invention are vertically disposed or are vertical direction fuses. Vertical fuses in accordance with the invention reduce the area occupied by the fuses. For example, if the horizontal fuses of a prior art design are 4 microns in length and 0.5 microns in width with a thickness of 0.5 microns, a change from the horizontal direction to the vertical direction results in about an 8 fold area reduction. The present invention also includes an adjustment method for adjusting the fuse resistance to maximize power consumption of the fuse which will in turn make it easier to blow the fuse. In a preferred embodiment, the vertical fuse includes a cavity which may be formed without the need for additional mask or process steps. One benefit of incorporating the cavity is that the cavity reduces the likelihood of heating the blown fuses.

The process used to form the structure described in FIGS. 1–6 is used to form vertical fuses in accordance with the present invention. Advantageously, the present invention provides vertical fuses to reduce chip layout area and the fuses are fabricated without additional process steps and masks. In other words, the vertical fuses are formed simultaneously in a fuse region of a semiconductor device with other structures in the device. A vertical fuse fabrication process will be described by way of example, for a memory device having memory array devices formed simultaneously with the vertical fuses.

Figure 7:
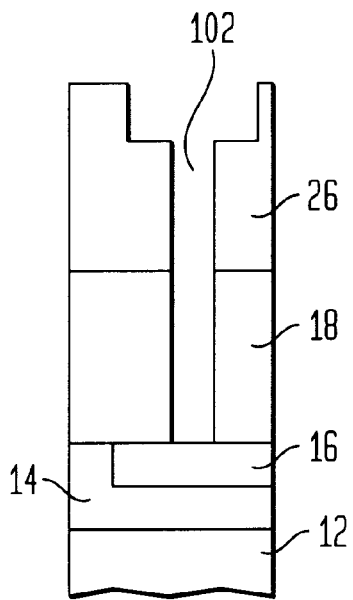
FIG. 7 is a cross-sectional view of a fuse region of a semiconductor device having a fuse hole formed through dielectric layers down to a conductive structure in accordance with the present invention.

Referring now in specific detail to the drawings in which like reference numerals identify similar or identical elements throughout the several views and initially to FIG. 7, a semiconductor substrate 12 is shown which may include silicon, silicon-on-insulator, gallium arsenide or other substrates known in the art. A conductive material 16 is deposited on dielectric layer 14. Other conductive structures may be formed as well for other types of semiconductor devices. A dielectric layer 14 is deposited and patterned according to processes known in the art. Dielectric layer 14 may include an oxide such as TEOS, thermal oxide, silane or high density polysilicon. A dielectric layer 18 is deposited on dielectric layer 14. Dielectric layer 18 may be an oxide such as silicon dioxide.

Figure 1:
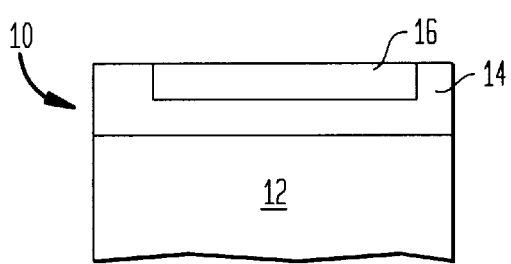
FIG. 1 is a cross-sectional view of a conventional substrate having a dielectric layer and metal structures formed thereon.
Figure 2:
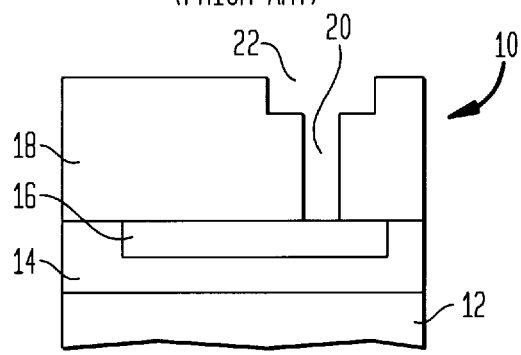
FIG. 2 is a cross-sectional view of the conventional substrate of FIG. 1 having a dielectric layer deposited thereon and a contact hole formed therein.
Figure 3:
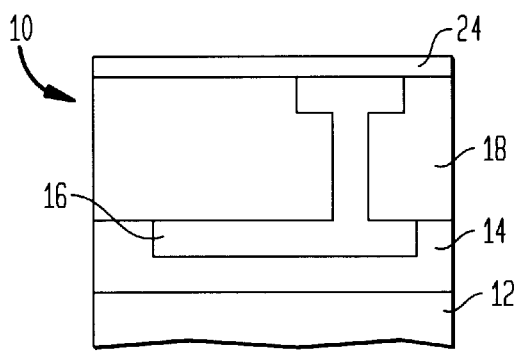
FIG. 3 is a cross-sectional view of the structure of FIG. 2 having a conductive material deposited in the contact hole during a dual damascene process in accordance with the prior art.
Figure 4:
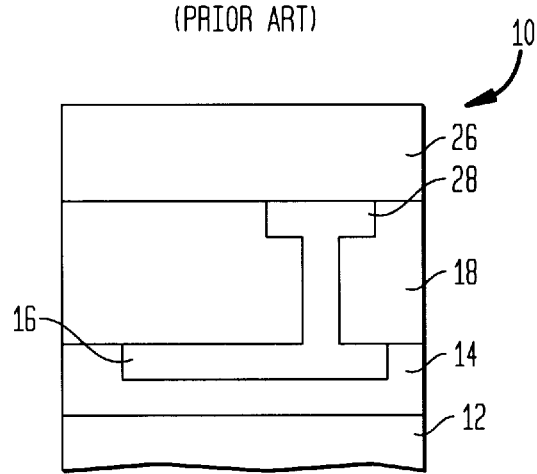
FIG. 4 is a cross-sectional view of the structure of FIG. 3 having another dielectric layer deposited thereon in accordance with the prior art.
Figure 5:
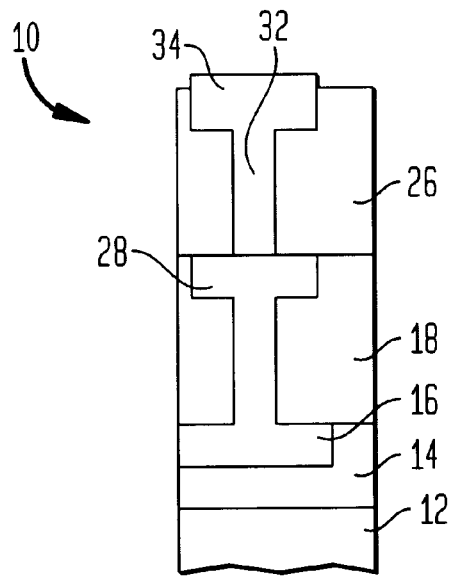
FIG. 5 is a cross-sectional view of the structure of FIG. 4 having a via hole formed through the other dielectric layer down to a contact in accordance with the prior art.
Figure 6:
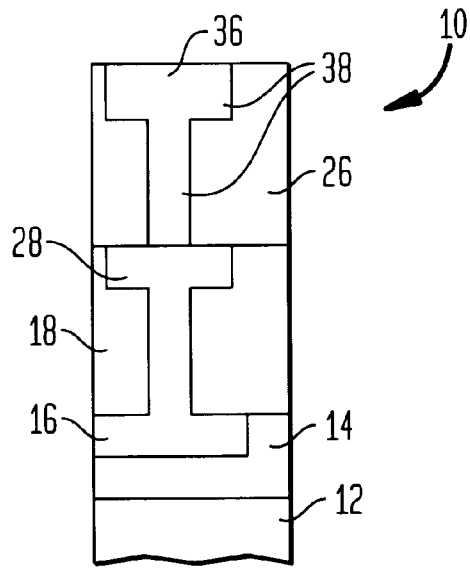
FIG. 6 is a cross-sectional view of the structure of FIG. 5 having a conductive material deposited in the via hole during a dual damascene process in accordance wit the prior art.

Dielectric layer 18 is patterned and etched in an array portion to form dual damascene structures as described above with reference to FIGS. 2 and 3 above. A chemical mechanical polishing (CMP) is performed to planarize a top surface of dielectric layer 18. A dielectric layer 26 is deposited on dielectric layer 18. Dielectric layer 26 is preferably an oxide such as silicon dioxide. Dielectric layer 26 is patterned and etched to form a dual damascene fuse hole 102 at the same time contact holes 32 and metal line trenches 34 for a dual damascene deposition are formed as shown in FIG. 5. The patterning of fuse hole 102 is preferably performed using lithography processing. Etching fuse hole 102 may be performed using a reactive ion etching (RIE) process or a chemical downstream etching (CDE) process, other etching techniques may also be implemented.

Fuse hole 102 extends through dielectric layer 18 and dielectric layer 26 to reach conductive material 16. The etching process described for etching dielectric layer 18 and dielectric layer 26 is preferably selective to conductive material 16. Conductive material 16 is preferably tungsten, aluminum or other conductive materials.

Figure 8:
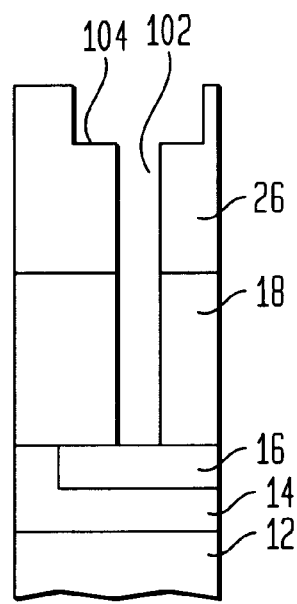
FIG. 8 is a cross-sectional view of the structure of FIG. 7 having a conductive layer or liner deposited in the fuse hole in accordance with the present invention.

Referring to FIG. 8, a thin conductive layer 104 is formed in fuse hole 102. Layer 104 is preferably a material having a higher resistivity than a base material or via used for the fuse and applied in subsequent steps. Layer 104 is formed by a deposition process, for example a chemical vapor deposition (CVD) process. Layer 104 lines fuse hole 102 (See also FIG. 9).

Figure 9:
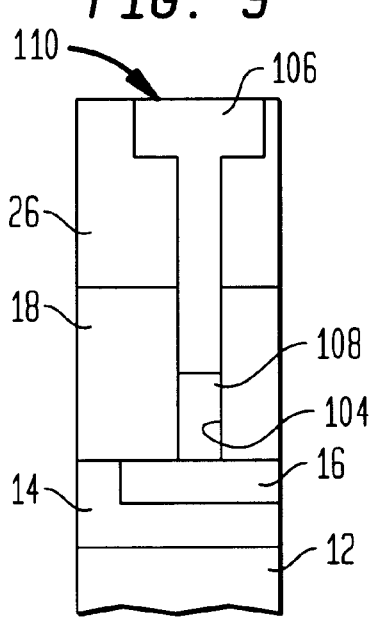
FIG. 9 is a cross-sectional view of the structure of FIG. 8 having a conductive material deposited in the fuse hole during a dual damascene process and forming a cavity having the liner line the vertical walls thereby forming a vertical fuse in accordance with the present invention.

Referring to FIG. 9, a dual damascene deposition process is employed to fill fuse hole 102 having layer 104. A conductive material 106 is deposited preferably using a physical vapor deposition process. Other conformal coating processes may be used. Conductive material 106 is preferably aluminum (Al), however other conductive materials may be used. In a preferred embodiment, layer 104 includes a metal nitride such as titanium nitride (TiN) which has a higher resistivity than Al. Other conductive materials and their alloys may be used for layer 104, for example copper. The deposition process includes the formation of a cavity 108 which permits volume expansion of layer 104 during fuse blow. A vertical fuse 110 is provided which significantly reduces layout area of the semiconductor device as compared to conventional horizontally disposed fuses.

Figure 10:
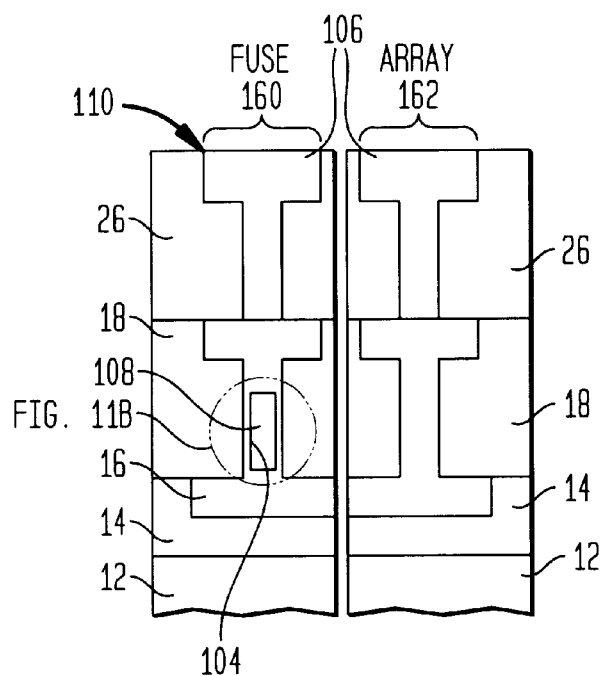
FIG. 10 is a cross-sectional view of a semiconductor device showing a fuse region and an array for memory chips in accordance with the present invention.

Referring to FIG. 10, a cross-sectional view of a semiconductor device shows a fuse region 160 and a memory array region 162 on the same semiconductor device in accordance with the present invention. Detail 11 is shown in greater detail in FIG. 11.

Figure 11:
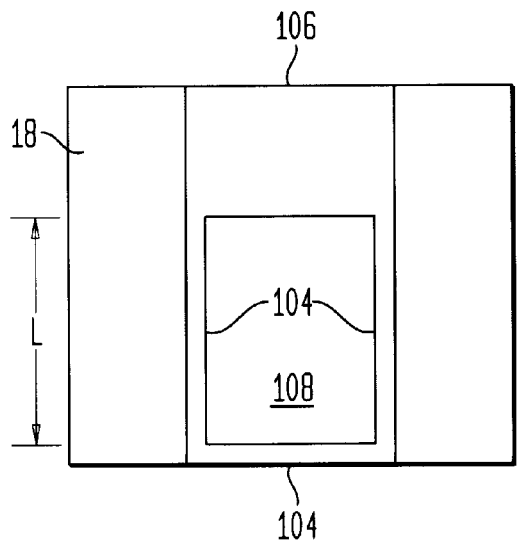
FIG. 11 is a magnified cross-sectional view of detail 11 shown in FIG. 10 showing a liner and a cavity in accordance with the present invention.

Referring to FIG. 11, a magnified view of a cavity region is shown. Layer 104 lines cavity 108 and conductive material 106 is deposited such that cavity 108 is formed. During operation of fuse 110, electrical current flows therethrough. When a predetermined amount of current flow through fuse 110, fuse 110 will blow. Due to the higher resistivity as well as its reduced cross sectional area of layer 104 as compared to conductive material 106, layer 104 will fail during $I^2R$ heating, where I is the current and R is the resistance of fuse 110 by melting. Cavity 108 permits layer 104 to melt due to the high temperatures created during current flow. Layer 104 expands into cavity 108 to break the conductive path through fuse 110.

Figure 12:
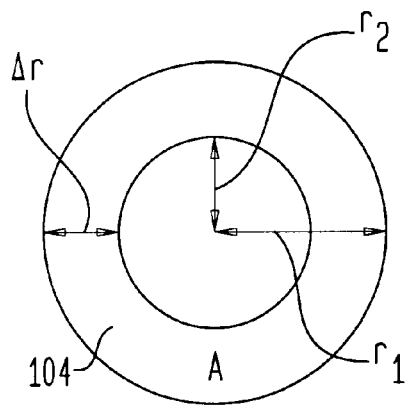
FIG. 12 is a cross-sectional view of the liner/conductive layer showing geometrical dimensions in accordance with the present invention.

One important aspect of fuse 110 is that fuse 110 may be tailored to blow at different currents and to maximize power consumption by fabricating fuses of different resistance (R). This may implemented in many ways. One way to maximize power consumption is to match resistance of fuse 110 to a resistance of external circuitry ($R_{ext}$). External circuitry may include a transistor (not shown) which supplies current to fuse 110. Referring to FIG. 12, resistance of fuse 110 may be tailored by varying a via width/radius, $r_1$ (radius or width to outside diameter/perimeter of conductive material 106 or inside diameter/perimeter of layer 104), a length "L" of cavity 108 (see FIG. 11) and/or a thickness, $\Delta r$, of layer 104. These relationships are related according to Equations 1 and 2 as follows:

$$A=\pi((2 \cdot r_1 \cdot \Delta r)-\Delta r^2) \qquad \text{EQ. 1}$$

$$R=\rho L/A \qquad \text{EQ. 2}$$

where A is the cross-sectional area of fuse 110 taken along a horizontal plane and $\rho$ is the resistivity of layer 104.

Figure 13:
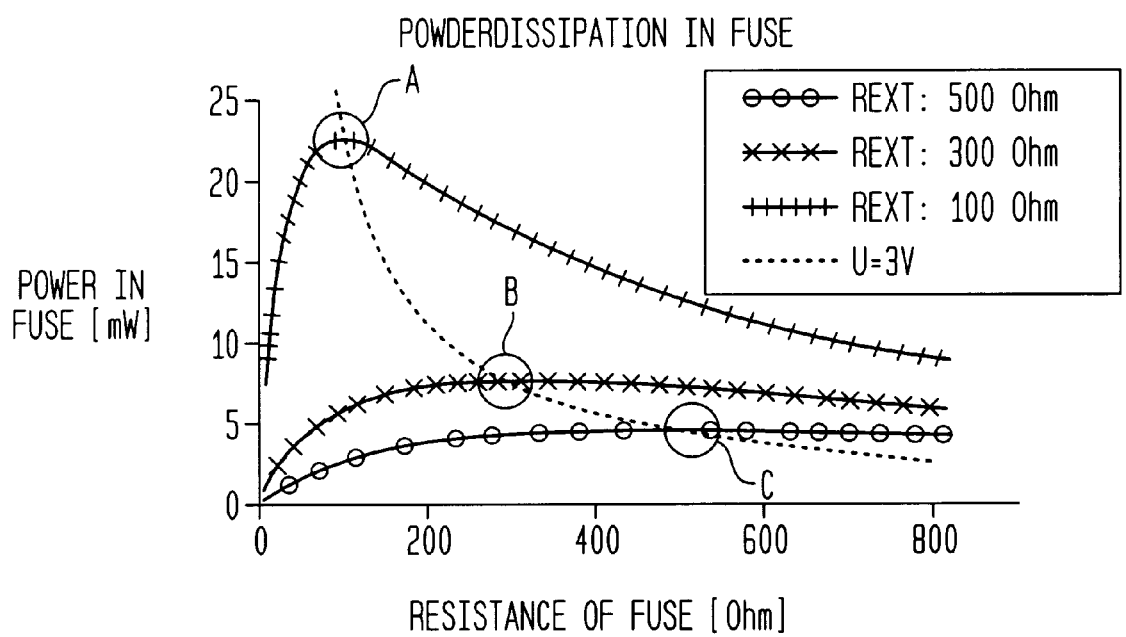
FIG. 13 is a graph showing power consumption in a fuse versus resistance of the fuse for different external resistances in accordance with the present invention.

Referring to FIG. 13, a graph of power consumption versus resistance in a vertical fuse in accordance with the present invention is shown. The graph shows points A, B and C of maximum power consumption which correspond to fuse resistance substantially equal to the external resistances ($R_{ext}$) shown in the legend. U is the voltage across the fuse.

Electrical tests performed by the inventors showed no dramatic differences between in resistance of Al studs (conductive material 106) with and without cavity 108. The difference in resistance varied by about a factor of 2. Due to the reduced cross-sectional area of the studs in cavity 108, there will be an increase in current density which in turn will increase the resistance and the temperature.

Figure 14:
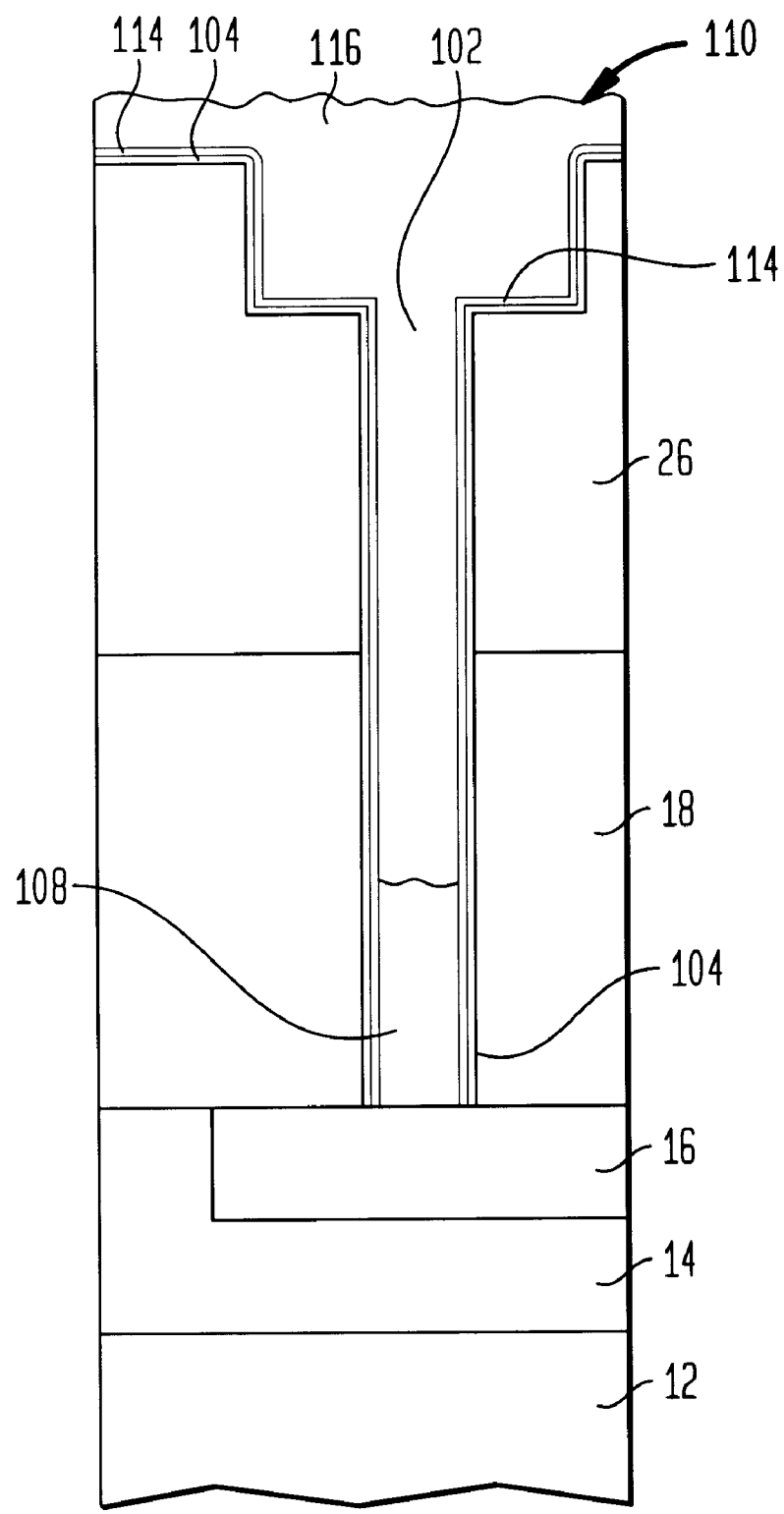
FIG. 14 is a cross-sectional view of one embodiment of the present invention having a fuse hole with a liner, a wetting Al layer and a physically deposited Al layer in accordance with the present invention.

Referring to FIG. 14, in accordance with one embodiment of the invention, conductive material 106 preferably does not fill fuse hole 102 completely. In one embodiment, a "Cool-Al-Fill" technique is used to fill fuse hole 102 and leave cavity 108 remaining therein. "Cool-Al-Fill" uses a CVD Al wetting layer 114 followed by a physical vapor deposition (PVD) or other conformal coating processed Al deposition layer 116. Layer 104 is formed prior to Al deposition and functions as a diffusion barrier to contain Al in fuse hole 102. Layer 104 is used as a liner material for enclosing cavity 108 formed for a vertical fuse according to the present invention. Layer 104 may include a stack of implanted (IMP) Ti (about 250 Å thick) and/or a CVD TiN (about 50 Å). The TiN preferably being used.

Figure 15:
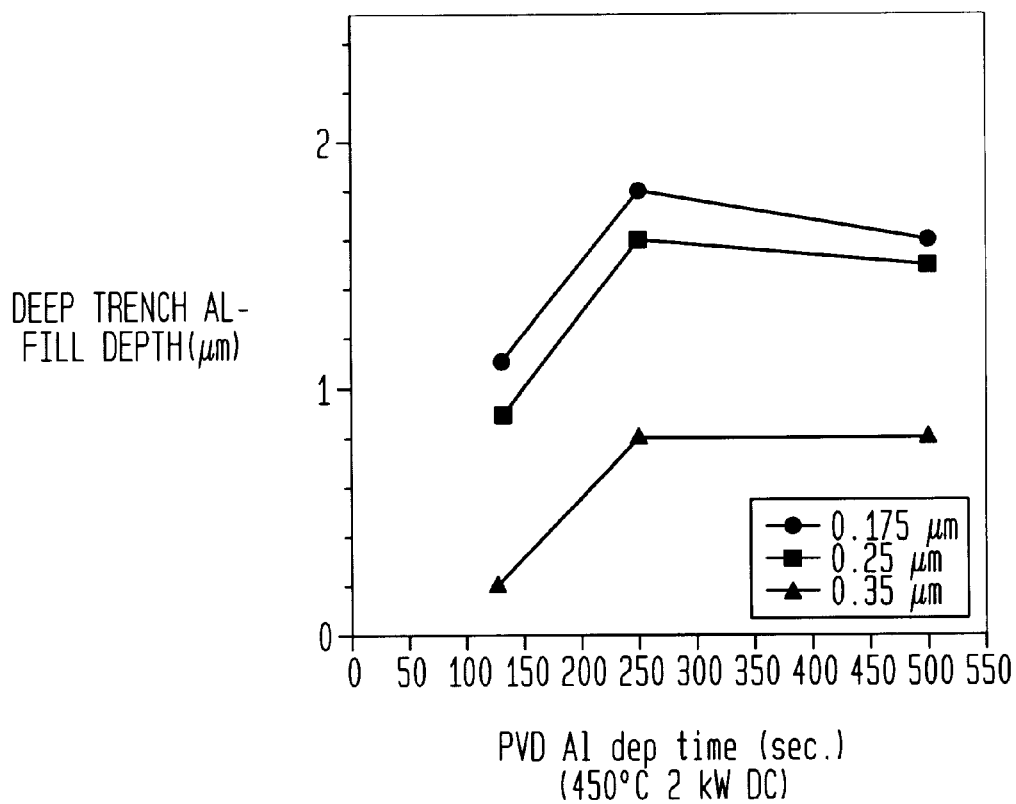
FIG. 15 is a graph showing depth of the physically deposited Al layer of FIG. 14 versus deposition time for different critical dimensions (CD) in accordance with the present invention.

The "Cool-Al-Fill" includes the following characteristics. Layer 104 is preferably a continuous film down to the bottom of fuse hole 102. Wetting layer 114 is preferably a discontinuous film, which means no additional conductor, i.e., only surfaces where layer 116 will be need to be wetted. Layer 116 has a fill depth which increases as via/contact diameter (fuse hole 102) decreases. These features permit control of the size (resistance) of cavity 108 by, among other things, varying a critical dimension (CD) of vertical fuse 110. As shown in FIG. 15, an illustrative graph shows depth of PVD Al fill versus deposition time for different critical dimensions (as indicated in the legend) of the fuse hole.

In one embodiment, vertical fuses 110 are formed simultaneously with array contacts (FIGS. 1–6). For vertical fuses 110 to be formed having cavity 108 therein, the critical dimension (diameter or width of the via/fuse hole 102) is preferably larger than contact/via hole 38. In this way, the formation of cavity 108 is ensured and independent of the conductive material deposition process. Further, the discontinuous Al film and the continuous TiN layer form a vertical fuse having a much higher resistance than contact/via holes 28 and 38 (FIGS. 1–6).

Figure 16:
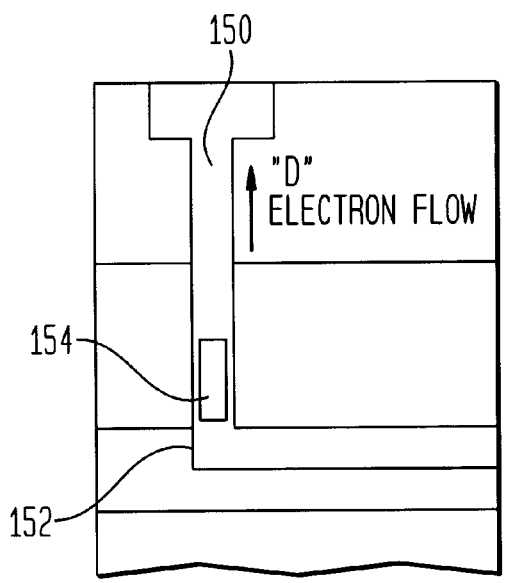
FIG. 16 is a cross-sectional view of another embodiment of the present invention having a bend in the fuse to decrease blow voltage in accordance with the present invention.

Referring to FIG. 16, a blow voltage of a vertical fuse 150 may be reduced by adding a bend 152 or bends into fuse 150. Modeling and experiments performed by the inventors have shown that such a configuration can drop the blow voltage by a factor of about 2. This may be altered depending on the geometry of the fuse. In one embodiment, a preferred direction of electron flow flows from bend 152 toward cavity 154 in the direction of arrow "D" because the cavity is located in a straight portion of fuse 150. A greater difference in blow voltage is thereby realized.

Having described preferred embodiments for vertical fuse and method of fabrication (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by letters patent is set forth in the appended claims.

What is claimed is:

1. A method for fabricating vertical fuses, comprising the steps of:

forming a fuse hole vertically through a dielectric layer of a semiconductor device;

lining sides of the fuse hole with a conductive layer; and depositing a conductive material in the fuse hole wherein the conductive layer has a resistivity greater than the conductive material, the conductive material forming a cavity having the conductive layer disposed along vertical surfaces adjacent to the cavity.

2. The method as recited in claim 1, wherein the step of depositing includes the step of depositing the conductive material using a dual damascene process.

3. The method as recited in claim 1, wherein the step of depositing includes the steps of:

depositing a wetting layer of conductive material; and depositing the conductive material in the fuse hole to form the cavity.

4. The method as recited in claim 3, wherein the wetting layer is deposited using a chemical vapor deposition process.

5. The method as recited in claim 1, wherein the conductive material is deposited using a physical vapor deposition process.

6. The method as recited in claim 1, further comprising the step of adjusting one of a conductive layer thickness and cavity dimensions to provide a predetermined blow voltage for the fuse.

7. The method as recited in claim 1, wherein the conductive material includes aluminum and the conductive layer includes titanium nitride.

8. The method as recited in claim 1, further comprising the step of matching a fuse resistance to a resistance in external circuitry to which the fuse is connected.

9. A method for fabricating vertical fuses simultaneously with contact and via structures, comprising the steps of:

providing a substrate;

depositing a first dielectric layer on the substrate;

forming contacts through the first dielectric layer;

depositing a second dielectric layer;

simultaneously forming fuse holes and via holes, the fuse holes being formed vertically through the first and second dielectric layers, the via holes being formed down to the contacts;

lining sides of the fuse holes and the via holes with a conductive layer; and depositing a conductive material in the fuse holes and the via holes wherein the conductive layer has a resistivity greater than the conductive material, the conductive material forming a cavity in the fuse holes having the conductive layer disposed along vertical surfaces adjacent to the cavity, the fuse holes being formed such that the same process forms cavities in the fuse holes while the via holes are filled.

10. The method as recited in claim 9, wherein the step of depositing includes the step of depositing the conductive material using a dual damascene process.

11. The method as recited in claim 9, wherein the step of depositing includes the step of depositing a wetting layer of conductive material.

12. The method as recited in claim 11, wherein the wetting layer is deposited using a chemical vapor deposition process.

13. The method as recited in claim 12, wherein the conductive material is deposited using a physical vapor deposition process.

14. The method as recited in claim 9, further comprising the step of adjusting one of a conductive layer thickness and cavity dimensions to provide a predetermined blow voltage for the fuses.

15. The method as recited in claim 9, wherein the conductive material includes aluminum and the conductive layer includes titanium nitride.

16. The method as recited in claim 9, further comprising the step of matching a fuse resistance to a resistance in external circuitry to which the fuse is connected.

17. A method for fabricating vertical fuses, comprising the steps of:

forming a fuse hole vertically through a dielectric layer of a semiconductor device;

lining sides of the fuse hole with a conductive layer; and depositing a conductive material in the fuse hole, the conductive material forming a cavity having the conductive layer disposed along vertical surfaces adjacent to the cavity.

18. The method as recited in claim 17, wherein the step of depositing includes the steps of:

depositing a wetting layer of conductive material; and depositing the conductive material in the fuse hole to form the cavity.

19. The method as recited in claim 18, wherein the wetting layer is deposited using a chemical vapor deposition process.

20. The method as recited in claim 17, wherein the conductive material is deposited using a physical vapor deposition process.

21. The method as recited in claim 17, further comprising the step of adjusting one of a conductive layer thickness and cavity dimensions to provide a predetermined blow voltage for the fuse.

22. The method as recited in claim 17, wherein the conductive material includes aluminum and the conductive layer includes titanium nitride.

23. The method as recited in claim 17, further comprising the step of matching a fuse resistance to a resistance in external circuitry to which the fuse is connected.

24. The method as recited in claim 17, wherein the conductive layer has a resistivity greater than the conductive material.

* * * * *